United States Patent
Alpert et al.

(10) Patent No.: US 7,296,252 B2
(45) Date of Patent: Nov. 13, 2007

(54) CLUSTERING TECHNIQUES FOR FASTER AND BETTER PLACEMENT OF VLSI CIRCUITS

(75) Inventors: Charles Jay Alpert, Round Rock, TX (US); Gi-Joon Nam, Austin, TX (US); Sherief Mohamed Reda, La Jolla, CA (US); Paul Gerard Villarrubia, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 417 days.

(21) Appl. No.: 10/996,293

(22) Filed: Nov. 22, 2004

(65) Prior Publication Data

US 2006/0031804 A1 Feb. 9, 2006

Related U.S. Application Data

(63) Continuation-in-part of application No. 10/896,495, filed on Jul. 22, 2004.

(51) Int. Cl.
G06F 17/50 (2006.01)
G06F 9/45 (2006.01)

(52) U.S. Cl. ............ 716/10; 716/1; 716/3; 716/5; 716/8; 716/9

(58) Field of Classification Search ............ 716/1, 716/3, 5, 8–10
See application file for complete search history.

(56) References Cited

U.S. PATENT DOCUMENTS

| | | | |
|---|---|---|---|
| 5,847,965 A * | 12/1998 | Cheng | 716/9 |
| 6,442,743 B1 * | 8/2002 | Sarrafzadeh et al. | 716/10 |
| 6,480,991 B1 * | 11/2002 | Cho et al. | 716/8 |
| 6,601,226 B1 * | 7/2003 | Hill et al. | 716/10 |
| 6,851,099 B1 * | 2/2005 | Sarrafzadeh et al. | 716/10 |

(Continued)

OTHER PUBLICATIONS

Alpert et al., "Multilevel Circuit Partitioning," IEEE Transactions on CADICS, vol. 17, No. 8, pp. 655-667, Aug. 1998.

(Continued)

*Primary Examiner*—Stacy Whitmore
*Assistant Examiner*—Helen Rossoshek
(74) *Attorney, Agent, or Firm*—Casimer K. Salys; Jack V. Musgrove

(57) ABSTRACT

A placement technique for designing a layout of an integrated circuit by calculating clustering scores for different pairs of objects in the layout based on connections of two objects in a given pair and the sizes of the two objects, then grouping at least one of the pairs of objects into a cluster based on the clustering scores, partitioning the objects as clustered and ungrouping the cluster after partitioning. The pair of objects having the highest clustering score are grouped into the cluster, and the clustering score is directly proportional to the total weight of connections between the two objects in the respective pair. The clustering scores are preferably inserted in a binary heap to identify the highest clustering score. After grouping, the clustering score for any neighboring object of a clustered object is marked to indicate that the clustering score is invalid and must be recalculated. The calculating and grouping are then repeated iteratively based on the previous clustered layout. Cluster growth can be controlled indirectly, or controlled directly by imposing an upper bound on cluster size.

18 Claims, 5 Drawing Sheets

U.S. PATENT DOCUMENTS

| | | |
|---|---|---|
| 7,073,144 B2 * | 7/2006 | Alpert et al. .................. 716/5 |
| 2004/0158802 A1 * | 8/2004 | Wong et al. ................... 716/3 |
| 2005/0015738 A1 * | 1/2005 | Alpert et al. ................ 716/10 |
| 2005/0132306 A1 * | 6/2005 | Smith et al. ................... 716/1 |
| 2005/0268267 A1 * | 12/2005 | Shang .......................... 716/9 |
| 2006/0031804 A1 * | 2/2006 | Alpert et al. ................ 716/10 |
| 2006/0063156 A1 * | 3/2006 | Willman et al. ............... 435/6 |
| 2006/0190899 A1 * | 8/2006 | Migatz et al. ................ 716/13 |

OTHER PUBLICATIONS

Karypis et al., "Multilevel Hypergraph Partitioning: Applications in VLSI Domain," IEEE Transactions on VLSI Systems, vol. 7, No. 1, pp. 69-79, Mar. 1999.

* cited by examiner

CLUSTERING TECHNIQUES FOR FASTER AND BETTER PLACEMENT OF VLSI CIRCUITS

CROSS-REFERENCE TO RELATED APPLICATION

The present application is a continuation-in-part of U.S. patent application Ser. No. 10/896,495, entitled "CLUSTERING-BASED MULTILEVEL QUADRATIC PLACEMENT," filed Jul. 22, 2004, which is hereby incorporated.

BACKGROUND OF THE INVENTION

1. Field of the Invention

The present invention generally relates to the fabrication and design of semiconductor chips and integrated circuits, more specifically to a method of designing the physical layout (placement) of logic cells in an integrated circuit and the wiring (routing) of those cells, and particularly to the use of placement algorithms in designing circuit layouts.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The component formation requires very exacting details about geometric patterns and separation between them. The process of converting the specifications of an electrical circuit into a layout is called the physical design.

The present invention is directed to an improved method for designing the physical layout (placement) and wiring (routing) of cells. Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML.

Placement algorithms are typically based on either a simulated annealing, top-down cut-based partitioning, or analytical paradigm (or some combination thereof). Recent years have seen the emergence of several new academic placement tools, especially in the top-down partitioning and analytical domains. The advent of multilevel partitioning as a fast and extremely effective algorithm for min-cut partitioning has helped spawn a new generation of top-down cut-based placers. A placer in this class partitions the cells into either two (bisection) or four (quadrisection) regions of the chip, then recursively partitions each region until a global coarse placement is achieved.

FIG. 1 illustrates a typical placement process according to the prior art. First, a plurality of the logic cells 2 are placed using the entire available region of the IC 4 as shown in the first layout of FIG. 1. After initial placement, the chip is partitioned, in this case, via quadrisection, to create four new regions. At the beginning of the partitioning phase some cells may overlap the partition boundaries as seen in the second layout of FIG. 1. The cell locations are then readjusted to assign each cell to a given region as shown in the final layout of FIG. 1. The process then repeats iteratively for each region, until the number of cells in a given region (bin) reaches some preassigned value, e.g., one. While FIG. 1 illustrates the placement of only seven cells, the number of cells in a typical IC can be in the hundreds of thousands, and there may be dozens of iterations of placement and partitioning. Analytical placers may allow cells to temporarily overlap in a design. Legalization is achieved by removing overlaps via either partitioning or by introducing additional forces and/or constraints to generate a new optimization problem. The classic analytical placers, PROUD and GORDIAN, both iteratively use bipartitioning techniques to remove overlaps. Eisenmann's force-based placer uses additional forces besides the well-known wire length dependent forces to reduce cell overlaps and to consider the placement area.

Analytical placers optimally solve a relaxed placement formulation, such as minimizing total quadratic wire length. Quadratic placers thus attempt to minimize the sum of squared wire-lengths of a design according to the formula:

$$\Phi(x,y) = \Sigma (x_i - x_j)^2 + (y_i - y_j)^2$$

in both the horizontal and vertical directions. Since x and y are independent of each other, they can be solved for separately. It can be shown that this optimization is equivalent to minimizing $\Phi(x)$ according to the formula:

$$\Phi(x) = \tfrac{1}{2} x^T A x - b^T x + c$$

where A is a matrix, x and b are vectors, and c is a scalar constant. The y component is solved analogously. Setting the derivative of this function to zero obtains the minimum value:

$$d\Phi(x)/dx=0.$$

Using the equivalent function, this last equation simplifies to the linear system $$Ax=b.$$

The solution to this linear system determines the initial locations of objects in the given placement region. This linear system can be solved using various numerical optimization techniques. Two popular techniques are known as conjugate gradient (CG) and successive over-relaxation (SOR). The PROUD placer uses the SOR technique, while the GORDIAN placer employs the CG algorithm. In general, CG is known to be more computationally efficient than SOR with a better convergence rate, but CG takes more central processing unit (CPU) time per iteration.

As device technology enters the new deep sub-micron (DSM) era, the role of placement has become more important, and more difficult. The complexity of IC designs in the DSM realm has been growing significantly mainly due to reduced device sizes. It is estimated that the number of transistors per chip will be over 1.6 billion by the year 2016. The current maximum number of objects readily handled by existing placement tools is in the range of tens of millions. While these existing placement tools could conceivably be used to find acceptable solutions with more than 10 million objects, it would likely take an unbearably long time to arrive at those solutions. Thus, current placement tools lack the scalability necessary to handle the ever-increasing number of objects in IC designs. Unfortunately, performance (i.e., quality assurance) and scalability contradict each other. Obtaining higher quality placement solutions requires more CPU time.

One approach to simplifying placement is to group objects into clusters, effectively reducing the overall number of objects which can then be placed with less computation time. In one form of clustering referred to as edge coarsening (EC) objects are visited in a random order and, for each object, all unmatched adjacent objects are considered and the one that is connected with the largest "weight" is matched for clustering. With EC, a hyperedge of k pins has a weight of 1/(k−1). In a modified EC approach known as first choice (FC), the cluster size is limited by discontinuing coarsening when the new coarsened number of objects a certain threshold. FC also allows an object to be clustered multiple times during a single iteration while EC forces each object to be clustered with another unmatched object during the current iteration. This difference results in more balanced clustering with EC. Another form of clustering transforms a given hypergraph into a graph (wherein every net has only 2 pins) by decomposing pins into a "clique" with an edge weight of 1/(k−1). The clustering algorithm then ranks edges according to a connectivity-based metric using a heap. The algorithm proceeds by clustering the highest ranking edge if its size does not exceed a certain size limit, and then updating the circuit netlist and the heap. The area of a cluster can be included in the objective function for cluster size balancing. Fine grain clustering (i.e., clusters of small sizes) can be used to improve placement runtime.

There are, however, several disadvantages to clustering. Hypergraph-to-graph transformation (decomposing a hyperedge into a clique) causes a discrepancy in the edge weights once any two objects that belong to same hyperedge are clustered, and leads to an unreasonably large size heap in heap-based implementations. Pass-based clustering methods such as EC that do not allow object revisiting lead to suboptimal choices since they are likely to forbid an object from clustering to its best neighbor. Finally, non-heap based implementations such as FC lead to suboptimal clustering choices since a clustered pair of objects might not be the best overall grouping. It would, therefore, be desirable to devise an improved method of clustering VLSI circuits to provide more scalable placement algorithms. It would be further advantageous if the new clustering technique could achieve better runtime characteristics while minimizing or reducing any degradation in the quality of the solutions.

SUMMARY OF THE INVENTION

It is therefore one object of the present invention to provide an improved method of placing logic cells on an integrated circuit (IC) chip.

It is another object of the present invention to provide such a method which enhances the scalability of the placement routines.

It is yet another object of the present invention to provide a method of designing the physical layout of an IC chip which can effectively reduce the number of objects in a design to facilitate placement in designs having very large numbers of objects.

The foregoing objects are achieved in a method of designing a layout of an integrated circuit, by calculating respective clustering scores for different pairs of objects in the layout based on connections of two objects in a given pair and the sizes of the two objects, then grouping at least one of the pairs of objects into a cluster based on the clustering scores, partitioning the objects as clustered and ungrouping the cluster after partitioning. In the illustrative implementation, the pair of objects having the highest clustering score are grouped into the cluster, and the clustering score is directly proportional to the total weight of connections between the two objects in the respective pair. More specifically, the clustering score d(u, v) for a pair of objects u and v is defined as $$d(u, v)=\Sigma_e(w_e)/[a(u)+a(v)]^k,$$

where $k \geq 1$, a(u) and a(v) are the areas of u and v respectively, and $w_e$ is the connection weight for a given hyperedge e of the pair of objects. The connection weight may vary according to the designer; an exemplary weight is 1/|e|. The clustering scores are preferably inserted in a binary heap to identify the highest clustering score. After grouping, the clustering score for any neighboring object of a clustered object is marked to indicate that the clustering score is invalid. The calculating and grouping are then repeated iteratively based on the previous clustered layout, and cluster growth is directly controlled by imposing an upper bound on cluster size.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
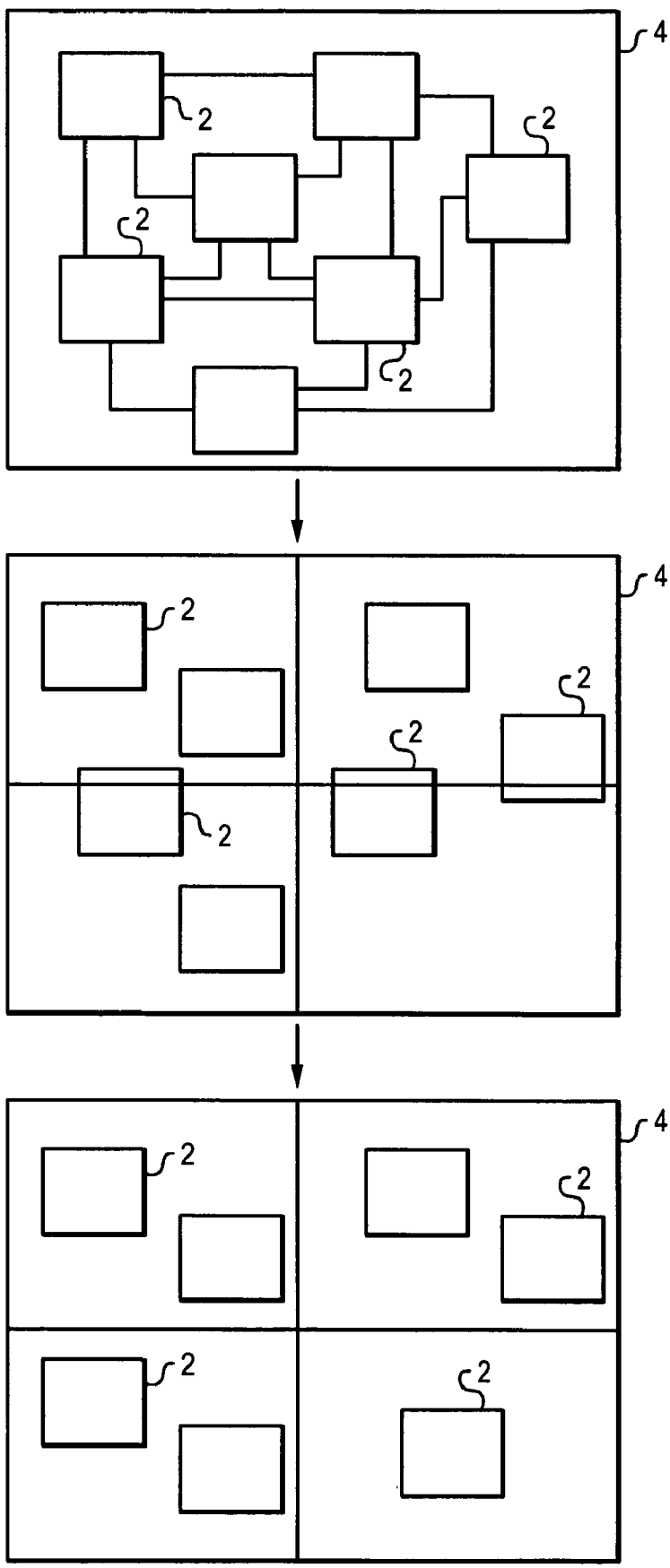
FIG. 1 is a series of plan views of an integrated circuit chip, illustrating a typical prior art placement and partitioning process for laying out the design of an integrated circuit.
Figure 2:
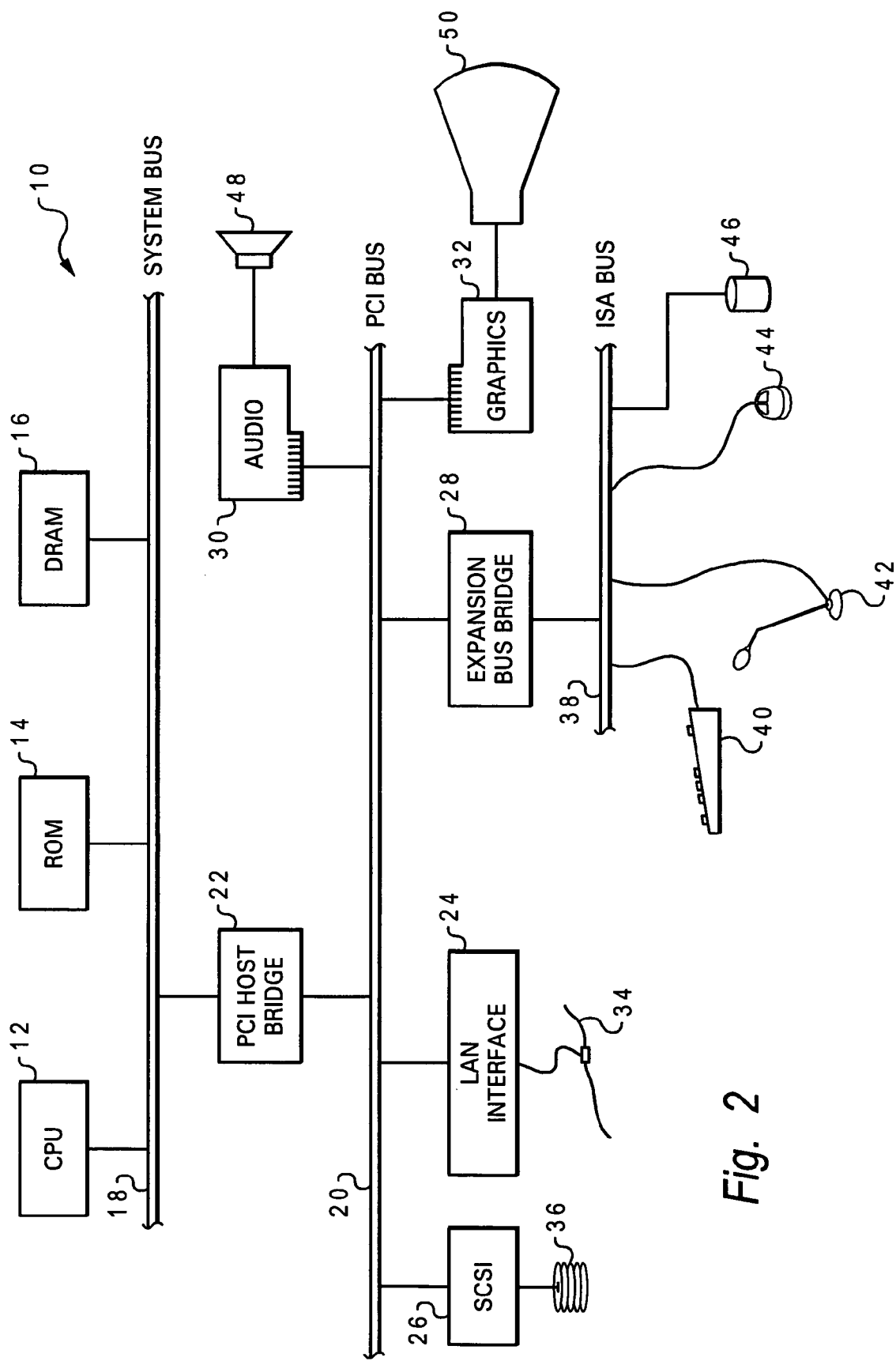
FIG. 2 is a block diagram of a computer system programmed to carry out computer-aided design of an integrated circuit in accordance with one implementation of the present invention.

With reference now to the figures, and in particular with reference to FIG. 2, there is depicted one embodiment 10 of a computer system programmed to carry out computer-aided design of an integrated circuit in accordance with one implementation of the present invention. System 10 includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches. In high performance implementations, system 10 may include multiple CPUs and a distributed system memory.

CPU 12, ROM 14 and DRAM 16 are also coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including the program which embodies the present invention as explained further below. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to carry out the integrated circuit design as taught herein.

While the illustrative implementation provides the program instructions embodying the present invention on disk drive 36, those skilled in the art will appreciate that the invention can be embodied in a program product utilizing other computer-readable media, including transmission media.

Computer system 10 carries out program instructions for placement of cells in the design of an integrated circuit, using a novel technique wherein objects to be placed are first grouped into clusters, then quadratically placed and partitioned recursively, with unclustering as the placement process progresses. Accordingly, a program embodying the invention may include conventional aspects of various quadratic optimizers and cut-based partitioners, and these details will become apparent to those skilled in the art upon reference to this disclosure.

In one embodiment, computer system 10 carries out the quadratic placement portion of the process using the linear system $Ax=b$ as derived in the Background section, but initially applies this process to collections of cells, rather than individual cells. By solving this equation as applied to these cell clusters, the optimal (or near-optimal) locations of the clusters can be determined to minimize the sum of squared wirelength. When an illegal placement solution arises (with substantial cell/cluster overlappings) a partitioning step uses the overlapping layout to assign cells to either 2 or 4 sub-regions (bins). The solution to the same linear system is used for the subsequent partitioning. Instead of minimizing the number of cuts, a geometric partitioning algorithm can be used to minimize the total sum of movements from the initial quadratic placement solutions. The placement process repeats recursively on each bin until eventually all the cells are in their own bins, and the placement is legal. Unclustering occurs as the process progresses as explained further below. The global placement is followed by a detailed placement which sets the exact coordinates of each object subject to row and slot constraints.

Figure 3:
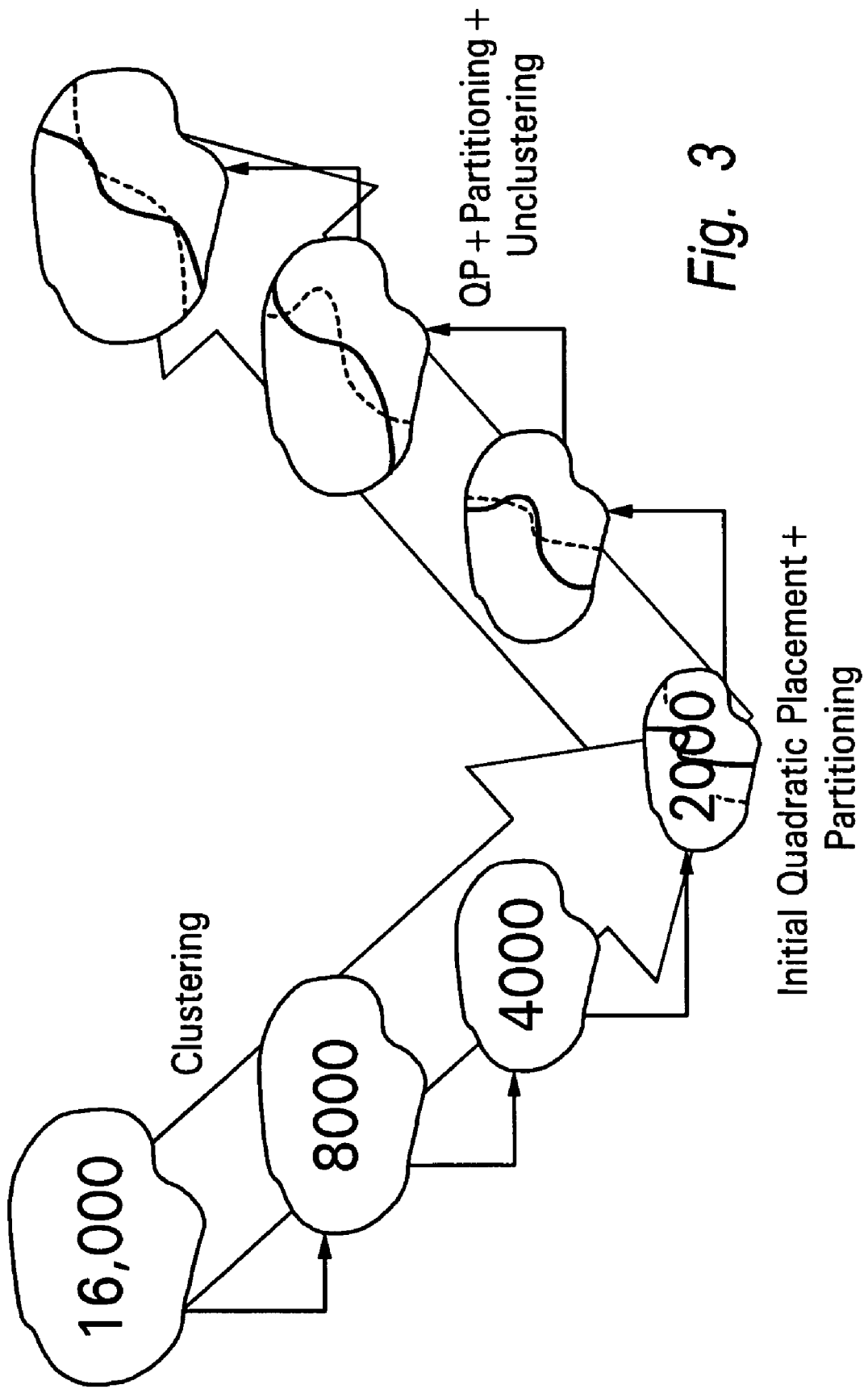
FIG. 3 is a diagram depicting the placement process in accordance with one implementation of the present invention, whereby objects are first grouped into clusters, then placed and partitioned recursively, with unclustering as the placement process progresses.

FIG. 3 shows the flow of the enhanced placement algorithm with clustering/unclustering techniques in accordance with an exemplary implementation. First, the cells are gradually clustered into a coarsened netlist. In this example, the layout begins with 16,000 cells (moveable objects). Clustering is iteratively performed, reducing the number of objects to 8,000, 4,000, then 2,000. At this point (based on operator input), the 2,000 objects undergo an initial quadratic placement followed by partitioning. This initial quadratic placement and partitioning is followed recursively with more quadratic placement (QP) and partitioning, and unclustering of the objects.

An initial problem arises as to how to group the cells into clusters. Clustering can be an efficient method to reduce the number of objects in a design, depending on the clustering strategy. The idea is to generate a single object from a set of tightly connected objects while preserving all of the connections to the outside. Small objects are preferably clustered first. Clustering can be performed iteratively, i.e., at multiple levels. In general, more clustering tends to generate more complex objects and net structures, but fewer numbers of moveable objects. The program operator can provide a control parameter to limit the amount of clustering, such as a factor by which the object count is to be reduced. Different clustering strategies produce different placement problem instances. When the same set of cells are clustered according to different strategies, they result in different nets for the clusters, and one net may have a more complex interconnection structure which is harder for a quadratic placer to optimize, and is unsatisfactory in comparison. Better clustering produces better quality of solutions, such as wire length and timing (shorter delay).

The present invention preferably groups objects (logic cells) into clusters based on clustering scores that are a function of connection weighting for a given pair of objects and the sizes of those objects. For a given set of objects, there is a set e of electrical connections for those objects referred to as a hyperedge. The connection weight we for a hyperedge is defined as the reciprocal of the number of connections, i.e., $w_e=1/|e|$. Given two objects u and v, their clustering score d(u, v) is defined as $$d(u, v)=\Sigma_e(w_e)/[a(u)+a(v)],$$

where a(u) and a(v) are the areas of u and v respectively. In other words, the clustering score of two objects is directly proportional to the total weight of connections between the two objects, and inversely proportional to the sum of their areas. Other parameters can be used to define the clustering score, such as geometric location.

The clustering scores are used to identify a "closest" neighboring object, that is, the closest object to u is defined as the neighboring object with the largest clustering score. The clustering process repeatedly identifies the closest pair of objects, and clusters them. This repeated clustering occurs until the target object number is reached. The target object number is the total number of unclustered objects divided by the given target clustering ratio. For example, a target clustering ratio of 10 means that the clustered netlist should have one-tenth the number of objects of the input netlist.

The present invention preferably uses a heap-based implementation to quickly identify the closest pair of objects. A heap is a binary tree structure, wherein higher level node scores are guaranteed to be higher than lower level nodes. A binary heap can be efficiently implemented as an array, where a node at index i has children at indexes $2i$ and $2i+1$ and a parent at index i/2 (with one-based indexing). This approach involves two phases. First, the closest object v of each object u in the netlist is calculated and the tuple (u, v, d) is inserted in the heap, where d is the clustering score between u and v. In the second phase, the top of the heap, i.e., the closest pair of objects, is picked and that pair is clustered. After clustering, the netlist is updated and any neighbor's score is re-calculated since clustering will likely change the connectivity information, leading to potentially different scores for the neighbors.

Figure 4A:
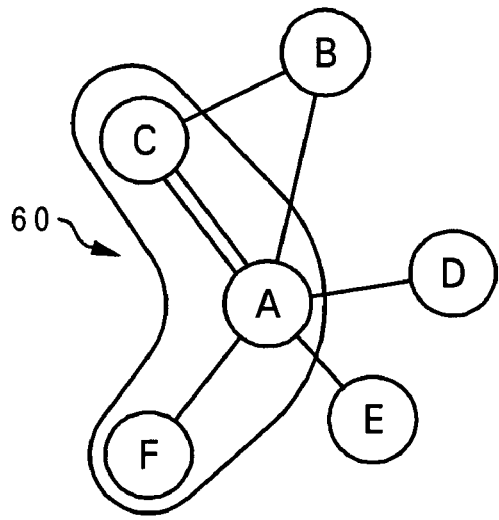
FIGS. 4A and 4B are pictorial representations of how a group of objects can be clustered in accordance with one implementation of the present invention.
Figure 4B:
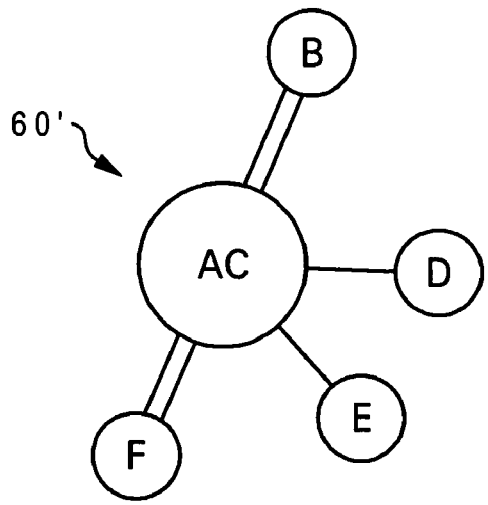

FIGS. 4A and 4B illustrate an example of how clustering occurs according to the foregoing technique. FIG. 4A shows a net-structure 60 comprised of six cells labeled A-F, each generally having the same area (i.e., a(N)=1). The input netlist has the following hyperedge: {C, B}, {C, A}, {C, A}, {A, C, F}, {A, D}, {A, E}, {A, F} and {A, B}. These connections are represented in FIG. 4A by the straight lines connecting the objects, and the closed loop around objects A, C and F. The clustering scores of A to its neighbors are: d(A, B)=1/2, d(A, C)=4/3, d(A, D)=1/2, d(A, E)=1/2, and d(A, F)=5/6. Since d(A, C) has the largest value, C is declared as the closest neighbor to A. If d(A, C) is the largest score in the heap then A will be clustered with C and the circuit netlist will be updated as shown in FIG. 4B. Given the new object AC, the new distances for the revised net-structure 60' will be: d(AC, B)=1, d(AC, D)=1/2, d(AC, E)=1/2, and d(AC, F)=1. The area of AC is 2.

In general, the connection weight of a hyperedge h can be variously modeled as given in Table 1. Model A gives the fraction of partitions or objects eliminated due to clustering of any two objects on h. Model B is similar to A but it provides more emphasis on two-pin nets. Model C gives the fraction of pins eliminated from h due to the clustering of any two objects on h.

TABLE 1

Different Net Models

| Net Model | Description |
| --- | --- |
| Model A | $w_h = 1/|h|$ |
| Model B | $w_h = 1/(|h| - 1)$ |
| Model C | $w_h = 1$ if $|h| = 2$, else $w_h = 1/|h|$ |

An analysis of this heap-based implementation will reveal that the most computationally (time) demanding step is the updating of the scores of the neighbors of newly clustered objects. However, this step can be simplified based on the following two observations. First, an object in the heap might be updated several times before making it to the top of the heap (if ever). Effectively, all updates before the last one are useless since it is the final update that matters. Secondly, based on a statistical analysis, the cluster score reduces in about 96% of the updates, i.e., objects are mainly moving down the heap rather than up.

Figure 5:
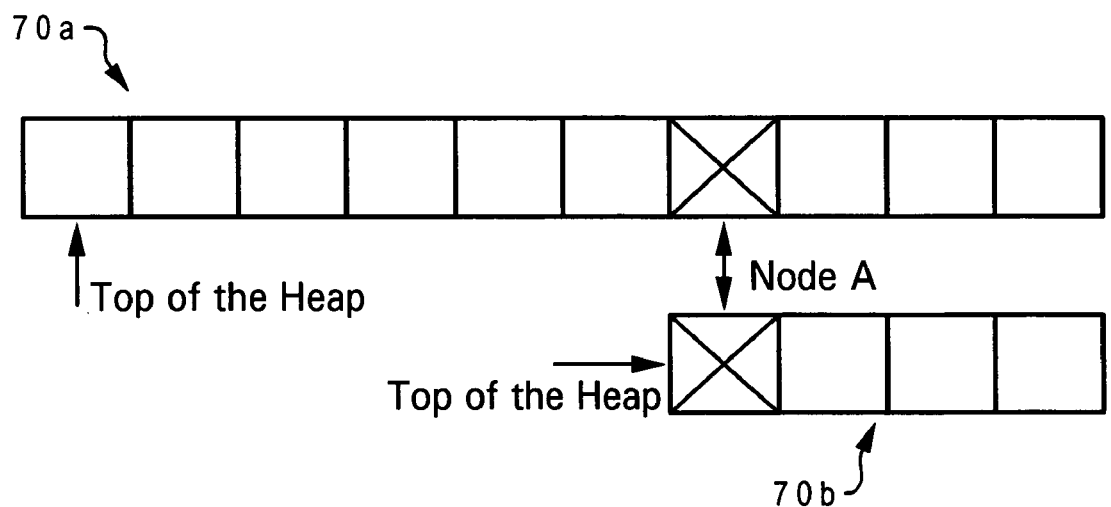
FIG. 5 is a schematic diagram illustrating how a node of a netlist can move to the top of a heap during the cluster process in accordance with one implementation of the present invention.

Based on these two observations, the present invention allows for updating of the heap in a "lazy" manner. The main idea behind lazy updating is to wait until an object (node) is at the top of the heap and then update its score if necessary. In the modified approach, neighboring objects are only marked as being "invalid" instead of updating their score. When an object is picked from the top of the heap, the validity flag is checked and if it is invalid, then its score is re-calculated and inserted in the heap as appropriate. Otherwise, it is clustered with its closest neighboring object. This procedure is illustrated in FIG. 5 which shows the heap array 70a. In the initial heap, node A is the $7^{th}$ entry. As clustering progresses, the higher level nodes are either clustered, or re-scored and re-inserted in the heap (if they were invalid). Eventually, node A rises to the top of the heap array 70b. If node A is still valid, it represents the current closest pair of objects which are then clustered.

Empirical results indicate that lazy updating manages to reduce the clustering runtime by up to 70% at practically no impact to wirelength (wirelength improved by 1.3%). Furthermore, the improvement in runtime increases as the benchmark size increases.

Cluster size growth can be controlled by a variety of methods. In one mode the growth is controlled indirectly via the clustering score equation for d(u, v). For this case, clusters yielding a large area receive a lower score, and consequently a lower score in the heap. A more generic approach calculates the clustering score as $$d(u, v)=\Sigma_e(w_e)/[a(u)+a(v)]^k,$$

where $k \geq 1$. The control parameter k can be either a fixed number or can be dynamically adjusted by setting it to $k=[a(u)+a(v)]/\mu$, where $\mu$ is average cell area multiplied by the clustering ratio $\alpha$ ($\mu$ represents the expected average cluster size). Another possibility is to use the total number of pins in a cluster since in general the number of pins in a cluster is well-correlated with the cluster area.

Cluster growth can also be directly controlled via imposing upper bounds on any cluster size. Two bounding methods include a "hard" and "soft" bounds:

Hard Bound: if the total area $a(u)+a(v) \leq k\mu$ then accept else reject;

Soft Bound: if the total area $a(u)+a(v) \leq k\mu$ then accept else accept with probability equal to $2^{[\mu/(a(u)+a(v))]k}-1$.

In the hard bound mode the upper bound is strictly enforced, but in a soft bound mode the upper bound is relaxed. A probabilistic method is used to achieve this relaxation, where the probability to cluster two objects declines as their area increase. The parameter k controls the amount of relaxation in the cluster size. The cluster bounds, whether hard or soft, can be incorporated while calculating the closest objects in various ways. Two ways include:

Method A: pick the closest object among all neighbors and check if the chosen object satisfies the area constraints;

Method B: pick the closest object from within the objects that satisfy the area constraints.

Method A ensures choosing the object with the largest score despite that it might get rejected because it violates the size constraints, while method B ensures that the chosen object meets the area constraints, despite that its cluster score might not be the greatest among all neighbors. Possible control modes are summarized in Table 2. Testing indicates that soft bounds give better results than hard bounds, and controlling via Method B is preferable over Method A.

TABLE 2

Area Control Modes

| Control Mode | Description |
| --- | --- |
| I | Indirect Size Control |
| II | Direct using Soft bound and Method B |
| III | Direct using Soft bound and Method A |
| IV | Direct using Hard bound and Method B |
| V | Direct using Hard bound and Method A |

Figure 6:
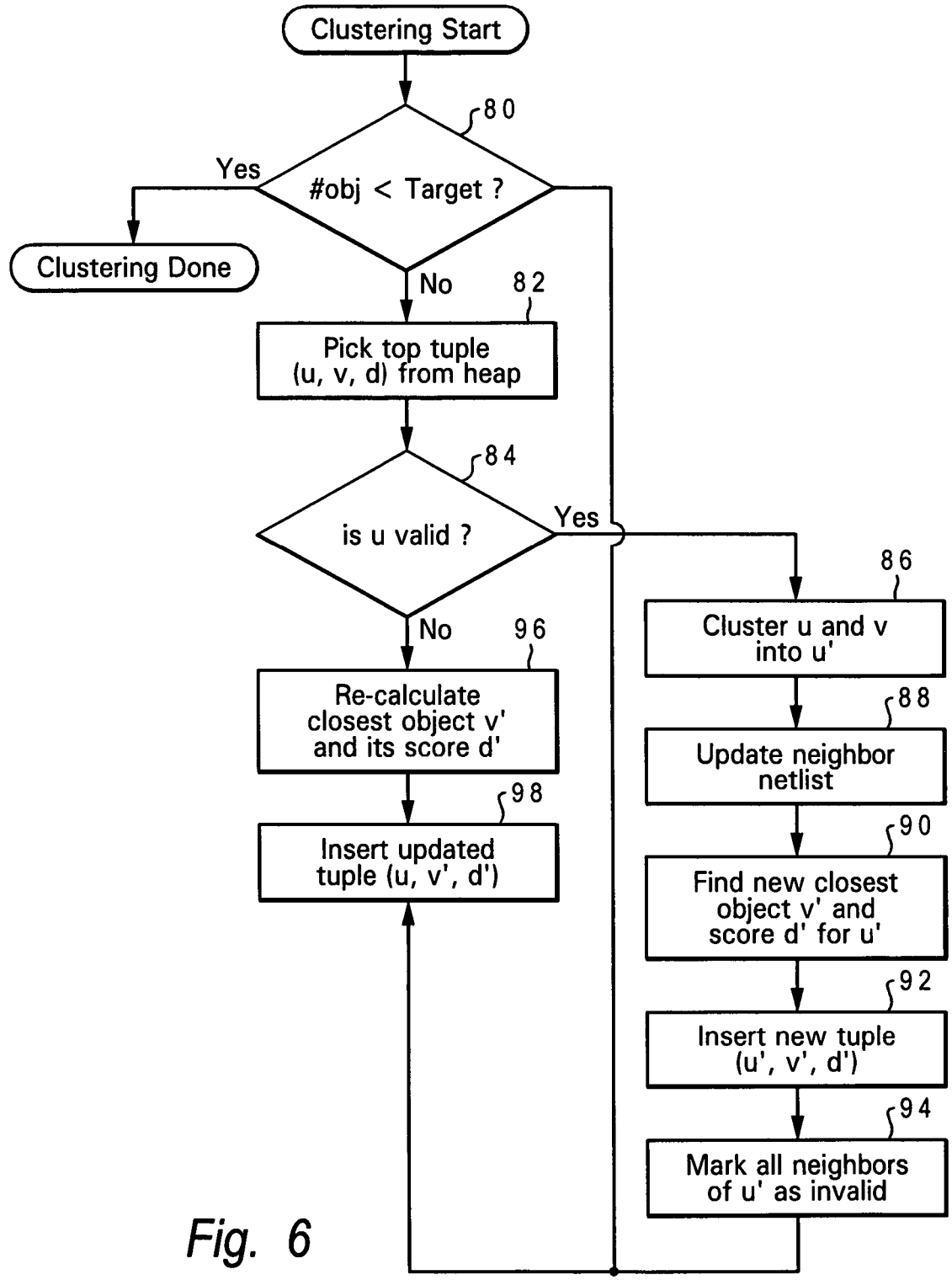
FIG. 6 is a chart illustrating the logical flow for clustering in accordance with one implementation of the present invention.

The preferred clustering technique may be further understood with reference to the flow chart of FIG. 6. The process begins by examining the number of objects currently in the net (80). If the number of objects is not less than the target number, the tuple (u, v, d) is picked from the top of the heap (82). The flag is checked to make sure u is valid, i.e., it has not been a neighbor of a previously clustered object (84). If u is valid, u and v are clustered into a new object u' (86). The netlist is then updated for all neighbors of u' (88). The process finds the new closest object v' and score d' for the new object u' (90). The new tuple (u', v', d') is inserted into the heap (92), and all neighbors of u' are marked as invalid (94). The process continues iteratively at step 80 by checking the new number of objects in the updated netlist. Returning to step 84, if u is not valid, the closest object v' is recalculated along with its score d' (96). The recalculated tuple (u, v', d') is inserted into the heap (98), and the process again returns to step 80. The process stops once the number of current objects is less than the target number.

Different strategies can also be used to ungroup the clusters as partitioning progresses. In a recursive partitioning placement, the size of the bins diminishes as placement progresses. It is thus possible to have a cluster object which is bigger than the size of a bin to which it is assigned, but this situation is undesirable because there should remain enough free space to produce a legal solution in any placement region. Therefore, an automatic unclustering technique can be employed in recursive partitioning placement for better quality of solutions wherein the size of a cluster is compared with the available free space in a bin. If the size of the cluster is larger than some fraction (i.e., 5%) of total free space available in a bin, the cluster can be dissolved into a set of smaller children objects (i.e., cells or sub-clusters). This strategy assures that every object within a bin is smaller than the actual bin size. Alternatively, a connection-based unclustering strategy can be used wherein an object is unclustered if the number of connections it has to external bins exceeds a certain threshold of its total number of connection. For example, an object having more than 50% of its connections to external bins is a good candidate for unclustering since different objects within it might need to move in separate directions depending on the external connections. This approach yields a consistent improvement in wirelength over size-based unclustering, but at the expense of runtime since the unclustered objects will increase the quadratic placer runtime.

The implementation of FIG. 3 may also be expressed in pseudo-code as follows:

```
B = Ø
generate clusters from initial objects
add entire_chip_area to B
while (any bin ε B has more objects than maxT)
    for each bin ε B with more objects than maxT
        extract bin from B
        construct linear equation A · x = b
        solve equation
        do bisection or quadrisection
        uncluster objects based on its size
        add sub_bins to B
    end for
end while
uncluster any clustered objects
do global_placement clean up
do detailed_placement
```

In this pseudo-code, "objects" refers to individual cells as well as cell clusters or sub-clusters. The algorithm starts by performing clustering on initial moveable objects. The degree of clustering is controlled by the operator input parameter. Whenever partitioning is performed during the placement, selective unclustering is executed based on the size of cluster objects. Once every bin size is fine-grained with a trivial number of objects (maxT) and if there still are clustered objects, those clusters are unconditionally unclustered. At this end point, there are the same set of objects as in the initial placement problem.

Simulations using the present invention indicate that it can achieve a significant speed-up in the layout process as compared to prior art techniques, with only marginal total wirelength degradation. In particular, the clustering strategies reduce CPU time significantly with insignificant loss of optimality, producing more balanced clusters, without introducing inaccuracies that can result when hypergraph-to-graph transformations are required.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention has been described in the context of a heap-based implementation, it could instead be pass-based. It is therefore contemplated that such modifications can be made without departing from the spirit or scope of the present invention as defined in the appended claims.

What is claimed is:

1. A method of designing a layout of an integrated circuit using a computer system, comprising:

calculating by said computer system respective clustering scores for different pairs of objects in the layout wherein the clustering score d(u, v) for a pair of objects u and v is defined as $$d(u, v)=\Sigma_e(w_e)/[a(u)+a(v)]^k,$$

where $k \geq 1$, a(u) and a(v) are the areas of u and v respectively, and $w_e$ is the connection weight for a given hyperedge e of the pair of objects;

grouping by said computer system at least one of the pairs of objects into a cluster based on the clustering scores; and partitioning by said computer system the objects as clustered and ungrouping the cluster after partitioning; and storing data representing the ungrouped, partitioned objects in said computer system.

2. The method of claim 1 wherein a pair of objects having the highest clustering score are grouped into the cluster.

3. The method of claim 1 wherein the connection weight $W_e$ is 1/|e|.

4. The method of claim 1 wherein the clustering scores are inserted in a binary heap to identify the highest clustering score.

5. The method of claim 4 wherein, after said grouping, the clustering score for any neighboring object of a clustered object is marked to indicate that the clustering score is invalid.

6. The method of claim 1 wherein said calculating and grouping are repeated iteratively based on a previous clustered layout, and cluster growth is directly controlled by imposing an upper bound on cluster size.

7. A computer system comprising:

one or more processors which process program instructions;

a memory device connected to said one or more processors; and program instructions residing in said memory device for designing a layout of an integrated circuit by calculating respective clustering scores for different pairs of objects in the layout wherein the clustering score d(u, v) for a pair of objects u and v is defined as $$d(u, V)=\Sigma_e(w_e)/[a(u)+a(v)]^k,$$

where $k \geq 1$, a(u) and a(v) are the areas of u and v respectively, and $W_e$ is the connection weight for a given hyperedge e of the pair of objects, grouping at least one of the pairs of objects into a cluster based on the clustering scores, and partitioning the objects as clustered and ungrouping the cluster after partitioning.

8. The computer system of claim 7 wherein a pair of objects having the highest clustering score are grouped into the cluster.

9. The computer system of claim 7 wherein the connection weight $W_e$ is 1/|e|.

10. The computer system of claim 7 wherein the clustering scores are inserted in a binary heap to identify the highest clustering score.

11. The computer system of claim 10 wherein, after said grouping, the clustering score for any neighboring object of a clustered object is marked to indicate that the clustering score is invalid.

12. The computer system of claim 7 wherein said calculating and grouping are repeated iteratively based on a previous clustered layout, and cluster growth is directly controlled by imposing an upper bound on cluster size.

13. A computer program product comprising:

a computer-readable medium; and program instructions residing in said medium for designing a layout of an integrated circuit by calculating respective clustering scores for different pairs of objects in the layout wherein the clustering score d(u, v) for a pair of objects u and v is defined as $$d(u, v)=\Sigma_e(w_e)/[a(u)=a(v)]^k,$$

where $k \geq 1$, a(u) and a(v) are the areas of u and v respectively, and $W_e$ is the connection weight for a given hyperedge e of the pair of objects, grouping at least one of the pairs of objects into a cluster based on the clustering scores, and partitioning the objects as clustered and ungrouping the cluster after partitioning.

14. The computer program product of claim 13 wherein a pair of objects having the highest clustering score are grouped into the cluster.

15. The computer program product of claim 13 wherein the connection weight $W_e$ is 1/|e|.

16. The computer program product of claim 13 wherein the clustering scores are inserted in a binary heap to identify the highest clustering score.

17. The computer program product of claim 16 wherein, after said grouping, the clustering score for any neighboring object of a clustered object is marked to indicate that the clustering score is invalid.

18. The computer program product of claim 13 wherein said calculating and grouping are repeated iteratively based on a previous clustered layout, and cluster growth is directly controlled by imposing an upper bound on cluster size.

* * * * *